United States Patent
Patruno et al.

(10) Patent No.: US 6,807,037 B1
(45) Date of Patent: Oct. 19, 2004

(54) ELECTRONIC EARTH LEAKAGE CURRENT DEVICE

(75) Inventors: Walter Patruno, Buccinasco (IT); Salvatore Brandonisio, Milan (IT); Paolo Antonello, Arluno (IT); John Samuel Beniston, Sandhausen (DE); Willy Schwarz, Unterstammheim (CH)

(73) Assignee: ABB Service S.r.l., Milan (IT)

( * ) Notice: Subject to any disclaimer, the term of this patent is extended or adjusted under 35 U.S.C. 154(b) by 223 days.

(21) Appl. No.: 10/169,404

(22) PCT Filed: Nov. 28, 2000

(86) PCT No.: PCT/EP00/12075
§ 371 (c)(1),
(2), (4) Date: Oct. 3, 2002

(87) PCT Pub. No.: WO01/50566
PCT Pub. Date: Jul. 12, 2001

(30) Foreign Application Priority Data

Dec. 30, 1999 (IT) .......................... MI99A2754

(51) Int. Cl.[7] ................................ H02H 3/00
(52) U.S. Cl. ................ 361/42; 361/44; 361/45
(58) Field of Search .................. 361/42, 44, 45, 361/50, 93.1, 94, 100, 115

(56) References Cited

U.S. PATENT DOCUMENTS

| | | | | |
|---|---|---|---|---|
| 4,331,999 A | | 5/1982 | Engel et al. | ................... 361/94 |
| 4,979,070 A | * | 12/1990 | Bodkin | ........................ 361/42 |
| 5,260,676 A | * | 11/1993 | Patel et al. | .................... 335/18 |
| 5,293,522 A | * | 3/1994 | Fello et al. | .................... 335/18 |
| 5,420,740 A | * | 5/1995 | MacKenzie et al. | .......... 361/45 |

FOREIGN PATENT DOCUMENTS

| | | | |
|---|---|---|---|
| DE | 3111255 A1 | 9/1982 | ............ H02H/7/26 |
| SU | 1631652 A2 | 2/1991 | ............ H02H/3/17 |

* cited by examiner

Primary Examiner—Stephen W Jackson
(74) Attorney, Agent, or Firm—Connolly Bove Lodge & Hutz LLP; Larry J. Hume

(57) ABSTRACT

An electronic earth leakage current device, comprising:
  a moving contact and a fixed contact which can be mutually coupled/uncoupled; and
  first sensor means for detecting an earth leakage current and for generating an electric signal which is indicative of the value of the earth leakage current; and
  first electronic means which are electrically connected to the first sensor means in order to generate, on the basis of the electric signal which is indicative of the value of the earth leakage current, an electric tripping signal; and
  actuation means, operatively connected to the moving contact, in order to perform, in response to an electric tripping signal, the separation of the moving contact from the fixed contact;
Its particularity consists of the fact that it comprises:
  second sensor means for detecting one or more physical values which are indicative of the operating condition of the electronic device for protection against earth leakage current; and
  second electronic means, electrically connected to the second sensor means, for receiving from the second sensor means electric signals which are indicative of the operating condition of the electronic device for protection against earth leakage current and for generating an electric tripping signal depending on the electric signals.

20 Claims, 4 Drawing Sheets

ELECTRONIC EARTH LEAKAGE CURRENT DEVICE

DESCRIPTION

The present invention relates to an electronic earth leakage current device for a low-voltage power line, having improved functionality.

In particular, the present invention relates to an electronic earth leakage current device, for single- or three-phase low-voltage power lines (therefore for voltage values below 1 KV).

Many examples of electronic earth leakage current devices for a low-voltage power line are known.

The main function of an electronic earth leakage current devices is to interrupt the power line if an earth leakage current (or residual earth fault current or imbalance current), above a certain preset threshold, is detected. The power line, on which a tripping event occurs, can be the power supply line (single- or three-phase) related to a specific load or to a local electrical user, for example of the industrial or domestic type.

The expression "earth leakage current" is to be understood as describing, for example, an earth fault current generated by any malfunction of the power line or of the electric loads to which the power line is connected.

For this reason, known electronic devices generally comprise the following functional elements (FIG. 1):
- a current sensor 1 for detecting an earth leakage current (also known as imbalance current or residual fault current) in a phase conductor of a power line 5;
- an electronic circuit 2 for processing a signal, which is indicative of the earth leakage current, sent by the current sensor 1.

Tripping events, which cause the interruption of the power line, occur, according to universally acknowledged technical standards, which set the technical requirements to be met in order to consider the electronic earth leakage current device safe for the user.

In common practice, a tripping characteristic is determined for each electronic earth leakage current device. This tripping characteristic depends on the constructive characteristics of the device and ultimately on the characteristics of the electronic circuit 2 of FIG. 1.

It is known that the electronic earth leakage current devices of the state of the art have drawbacks.

First of all, known electronic earth leakage current devices are generally not provided with monitoring systems, which allow to easily check the operating condition of the device and to interrupt the power line, if necessary. This can be a source of many problems for the user. For example, a high operating temperature, caused by environmental factors or internal faults, can cause a malfunction of the device, which can compromise its safety.

The absence of monitoring of the voltage level of the power line also can lead to malfunctions of the device and to damage to the electric devices powered by the power line, without having a tripping event.

The operating condition of the device in relation to its connection to the conductors of the power line to which it is connected is also very important.

If monitoring of the connection status of the conductors (neutral or ground or phase) of the power line is not provided, the device may fail to operate due to the interruption of one of said conductors or due to their incorrect connection. In practice, in such situations an earth leakage current in the power line would not trip the earth leakage current device. Accordingly, no protection of any kind would be provided for a user who happened to interact in some way with the power line and/or with the load supplied by said line. This fact entails considerable safety problems, which, at present, can be solved by coupling an electromechanical protection device to the electronic earth leakage current device, with a considerable increase in installation costs.

Furthermore, known earth leakage current devices generally comprise electronic circuits for setting the minimum tripping current and/or the maximum time interval for tripping. These circuits are generally constituted by electronic networks of the RC type, which process the electric signal, which is indicative of the value of the earth leakage current, that arrives from the current sensor. For example, the maximum time interval is commonly set by means of introducing a time delay proportional to the detected earth leakage current value. Although the technical solutions that are commonly adopted allow to preset some important parameters that characterize the tripping criteria of the electronic earth leakage current device, they do not allow to define in advance its overall behavior and therefore the trend of its tripping characteristic. This fact entails a high degree of uncertainty as to the behavior of the device for high earth leakage current values, for which the proportional delay introduced by commonly adopted technical solutions tends to drop to negligible values.

In this manner, there is no longer any control over the tripping times of the electronic earth leakage current device, which substantially depend on the level of wear of the mechanical or electromechanical components of the electronic earth leakage current device. This fact can lead, for example, to unexpected interruptions of the power line that are a severe annoyance for the user. Furthermore, considerable problems can occur if an electric system includes electronic earth leakage current devices in a cascade configuration (for example a device of a general type, connected to a network with selective-type devices). In this case, the uncertainty, related to the minimum tripping time, causes problems in managing the tripping events of the whole network of devices. In addition to this drawback, there is the fact that, since the tripping characteristic is difficult to predetermine, many devices can fail to comply with the standards during testing and inspection. This fact entails, in addition to a high degree of uncertainty as to the compliance of the earth leakage current device to the applicable standards, many difficulties, if it is necessary to meet particular requirements of the electrical user for which the device is intended. For example, it is difficult to determine in advance whether a device must be of the general or selective type or must have a more complex tripping characteristic. Accordingly, complex calibration operations are necessary, in order to achieve a tripping characteristic, which approximates as closely as possible the intended one.

Another drawback arises from the fact that known electronic earth leakage current devices are generally designed to use very specific types of actuator. In practice, the electronic circuits that generate the tripping signal are capable of driving only a certain type of actuator. If one decides to change the type of actuator, then the entire device must be redesigned in order to ensure satisfactory performance.

Another drawback arises from the fact that, in the known electronic earth leakage current devices, the design of the electronic circuits for generating the signal very often takes marginally into account the operating condition of the sensor devices, suitable to detect the presence of an earth leakage current. In particular, technical solutions for monitoring, with diagnostics of the ON/OFF type, the operating condition of the sensor means are very often all that is provided. Since said sensor means have to interface with electronics designed for other specific purposes (the generation of a tripping signal if a certain level of earth leakage current is exceeded), they can find themselves in non-optimum operating conditions, negatively affecting the performance of the entire electronic protection device.

Therefore, the aim of the present invention is to provide an electronic leakage current device for a low-voltage power line, which allows interrupting the power line, if an operating condition that compromises the correct operation of said electronic leakage current device occurs.

Within the scope of this aim, an object of the present invention is to provide an electronic leakage current device, which allows interrupting the power line if its operating temperature exceeds a preset threshold.

Another object of the present invention is to provide an electronic leakage current device, which allows interrupting the power line if the voltage of the power line exceeds a preset threshold.

Another object of the present invention is to provide an electronic leakage current device, which allows interrupting the power line, if an interruption of the neutral and/or ground conductors of the power line occurs or if an incorrect connection of the phase and neutral conductors occurs.

Another object of the present invention is to provide an electronic leakage current device, which allows to easily preset the trend of the tripping characteristic of said device.

Another object of the present invention is to provide an electronic leakage current device, which allows to use several actuation devices without substantial modifications to the electronic circuits suitable to generate the tripping signal for said actuation devices.

Another object of the present invention is to provide an electronic leakage current device, which allows to optimize the operation of the sensors suitable for detecting the earth leakage current.

Another object of the present invention is to provide an electronic leakage current device, which allows to interrupt the power line if the sensors suitable to detect an earth leakage current malfunction.

Another object of the present invention is to provide an electronic leakage current device, which is easy to manufacture and at modest costs.

Thus, the present invention provides an electronic leakage current device for a low-voltage power line, comprising:
   a moving contact and a fixed contact which can be mutually coupled/uncoupled; and
   first sensor means for detecting a leakage current and for generating an electric signal which is indicative of the value of said earth leakage current; and
   first electronic means which are electrically connected to said first sensor means in order to generate, on the basis of said electric signal, which is indicative of the value of said earth leakage current, an electric tripping signal; and
   actuation means, operatively connected to said moving contact, in order to perform, in response to command electric signals, the separation of said moving contact from said fixed contact;
The electronic leakage current device, according to the present invention, is characterized in that it comprises:
   second sensor means for detecting one or more physical values, which are indicative of the operating condition of said electronic device for protection against earth leakage current; and
   second electronic means, electrically connected to said second sensor means, for receiving from said second sensor means electric signals, which are indicative of the operating condition of said electronic leakage current device and for generating said electric tripping signal depending on said electric signals.

The electronic leakage current device, according to the present invention, allows achieving the intended aim and objects. In fact, it ensures, by virtue of the presence of the second sensor means and of the second electronic means, the possibility to detect abnormal operating conditions, which might compromise the safety of the device. In practice, an abnormal operating condition is considered in the same manner as an earth leakage current and produces the tripping of the electronic leakage current device. This forces the user to intervene in safety on the power line or on the electronic device itself in order to restore normal operating conditions.

Further characteristics and advantages of the invention will become apparent from the detailed description of a preferred embodiment of the electronic leakage current device, according to the present invention, illustrated only by way of non-limitative example in the accompanying drawings, wherein.

Figure 1:
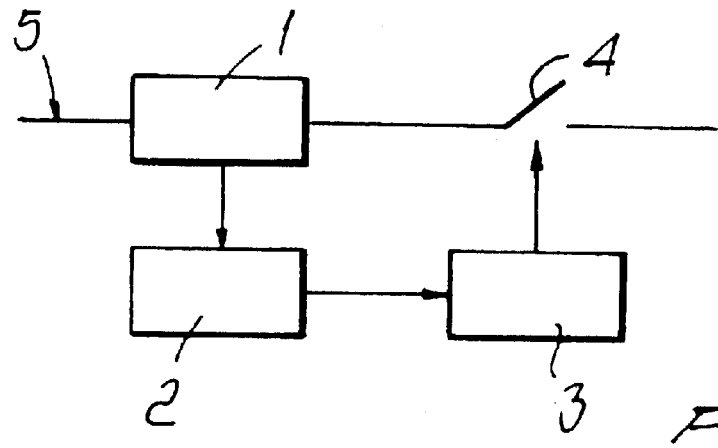
FIG. 1 is a block diagram of an electronic leakage current device of a known type.
Figure 2:
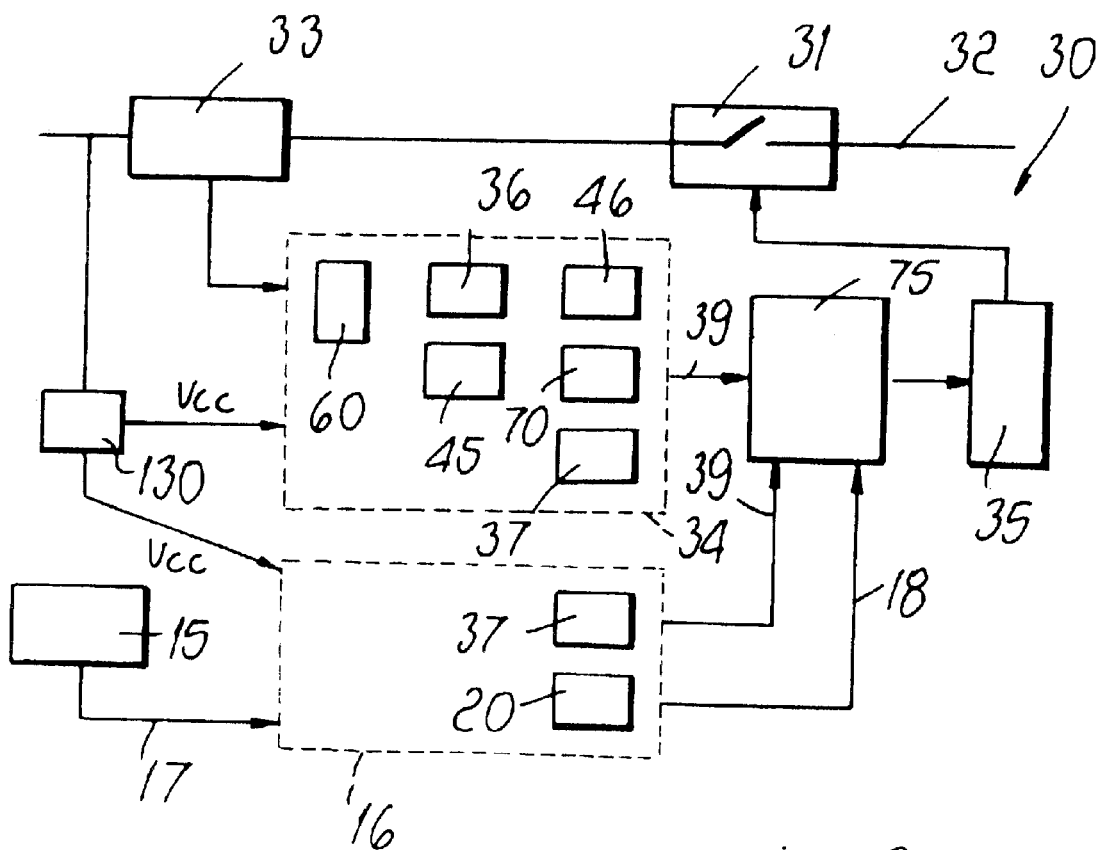
FIG. 2 is a schematic view of an electronic leakage current device, according to the invention.

The structure of an electronic leakage current device (reference 30), according to the invention is illustrated schematically with reference to FIG. 2.

The device 30, comprises a moving contact and a fixed contact which can be mutually coupled/uncoupled (reference 31). The separation of the moving contact from the corresponding fixed contact obviously produces the interruption of a power line 32.

The power line 32 can be of the single-phase or three-phase type, according to the requirements of the electric user. The device 30 comprises first sensor means 33 for detecting an earth leakage current in a phase conductor of the power line 32. The sensor means 33 therefore generate an electric signal indicative of the value of the detected earth leakage current.

According to a preferred embodiment, the first sensor means 33 comprise at least one current transformer provided with a primary winding which comprises the conductors of the power line 32. In the case of a three-phase power line, the primary winding of the current transformer can comprise the conductors of the power line 32. Accordingly, an electric current signal flows in the secondary winding of the transformer in response to the presence of an earth leakage current in the phase conductor that constitutes the primary winding. This electric current signal is therefore indicative of the value of the earth leakage current.

The device 30, according to the invention, furthermore comprises first electronic means 34, electrically connected to the first sensor means 33. The first electronic means 34 generate an electric tripping signal depending on the electric signal indicative of the value of the earth leakage current (such as for example the one sent by the sensor means 33). The device 30 furthermore comprises actuation means 35, operatively connected to the moving contact of electric contacts 31. The actuation means 35 produce, in response to an command electric signals 750, the separation of the moving contact from the corresponding fixed contact and, therefore, cause the interruption of the power line 32.

The actuation means 35 can be, for example, of the electromagnetic type (solenoid).

Figure 3:
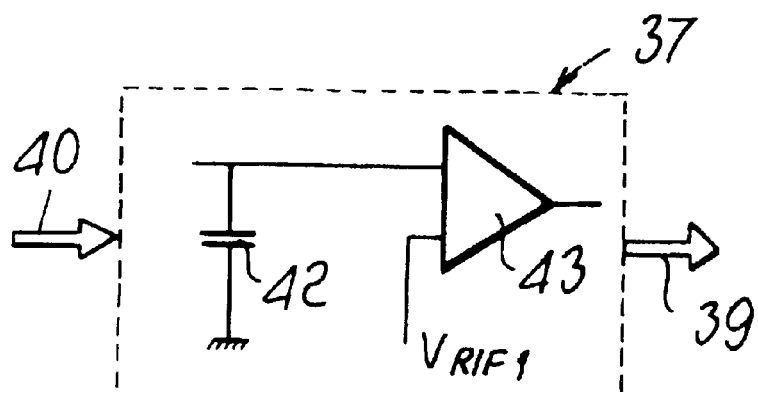
FIG. 3 is a schematic view of a constructive detail of the electronic leakage current device, according to the invention.

Again with reference to FIG. 2, the device 30 comprises second sensor means 15 for detecting one or more physical values, indicative of the operating condition of the electronic protection device and second electronic means 16. The electronic means 16 are electrically connected to the sensor means 15, in order to receive signals 17 indicative of the operating condition of the electronic protection device. Furthermore, the second electronic means 16 generate an electric tripping signal 18, depending on the electric signals 17. Advantageously, the first and second electronic means 34 and 16 comprise a first circuit network 37 for generating an electric tripping signal following the reception in input of an electric current signal. The circuit network 37 preferably comprises (FIG. 3) a first capacitive element 42, which is connected to earth. The capacitive element 42 is charged by an electric current signal 40 in input, so as to generate a charging voltage. A first comparator element 43, electrically connected to the capacitive element 42, receives in input said charging voltage and generates the electric tripping signal 39, if said charging voltage exceeds a preset reference voltage $V_{R1F2}$.

Figure 4:
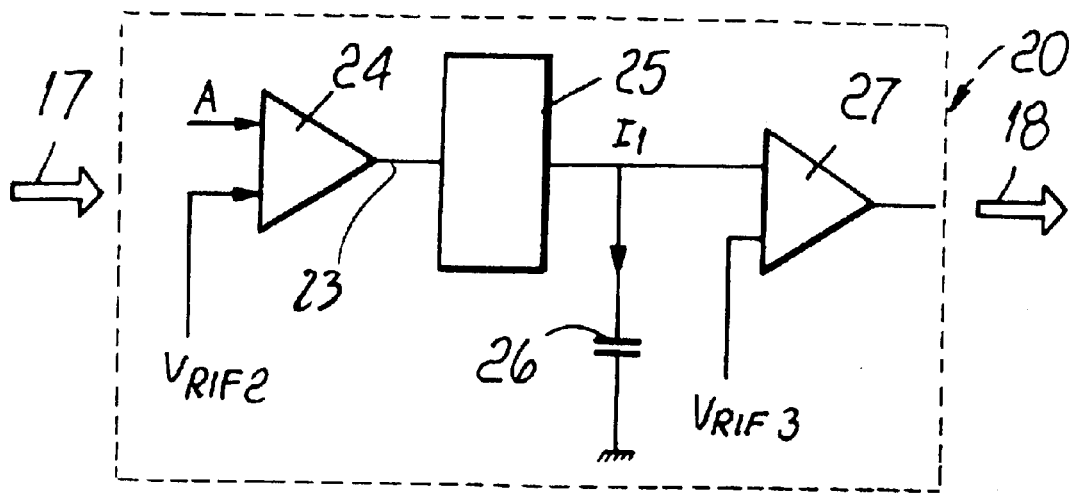
FIG. 4 is a schematic view of another constructive detail of the electronic leakage current device, according to the invention.

Advantageously, furthermore, the electronic means 16 comprise (FIGS. 2 and 3) a second circuit network 20 for generating an electric tripping signal 18, following the reception in input of an electric voltage signal 17. The electric signal 17 is indicative of the detected operating condition. The circuit network 20 (FIG. 4) comprises a second comparator element 24 for generating a first enable signal 23, if said electric voltage signal 17 exceeds a preset reference voltage $V_{R1F2}$. The circuit network 20 furthermore comprises a second circuit block 25 for generating an electric current signal 11 following the reception of said first enable signal 23. The signal 11 is applied in input to a second capacitive element 26 which is connected to the earth. The second capacitive element 26 is charged by the electric current signal 11, so as to generate a charging voltage. A third comparator element 27 is electrically connected to the capacitive element 26. The comparator element 27 receives in input the charging voltage and generates an electric tripping signal 18 if said charging voltage exceeds a preset reference voltage $V_{R1F3}$.

Figure 5:
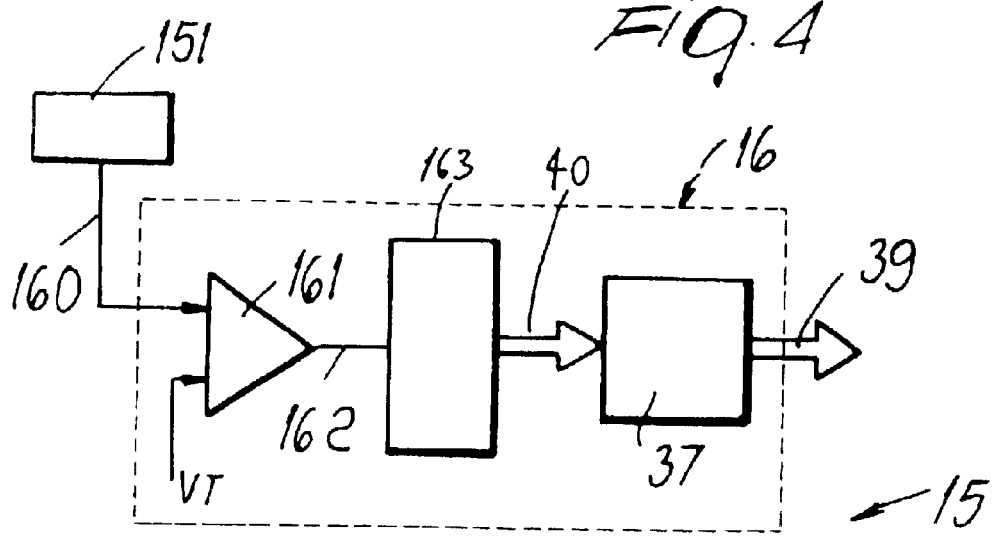
FIG. 5 is a schematic view of another constructive detail of the electronic leakage current device, according to the invention.

With reference now to FIG. 5, the second sensor means 15 comprise at least one sensor 151, which is arranged inside and/or outside the device 30. The sensor 151 detects the operating temperature of the device 30 and generates an electric signal 160, which is indicative of the value of said detected temperature and is meant to be sent to the second electronic means 16. The sensor 151 can be provided, for example, by using an appropriately configured transistor, according to one of the known electronic design techniques.

The sensor 151 is electrically connected to a fourth comparator element 161 in order to generate a second enable signal 162 if the electric signal 160 exceeds a preset reference voltage $V_T$.

The comparator element 161 is electrically connected to a first circuit block 163 in order to generate, following the reception of the enable signal 162, an electric current signal 40, sent in input to the first circuit network 37, which generates an electric tripping signal 39.

In this manner, as soon as the operating temperature of the device 30 exceeds a preset threshold, the power line is interrupted. Accordingly, any condition of potential danger for the user is prevented.

Figure 6:
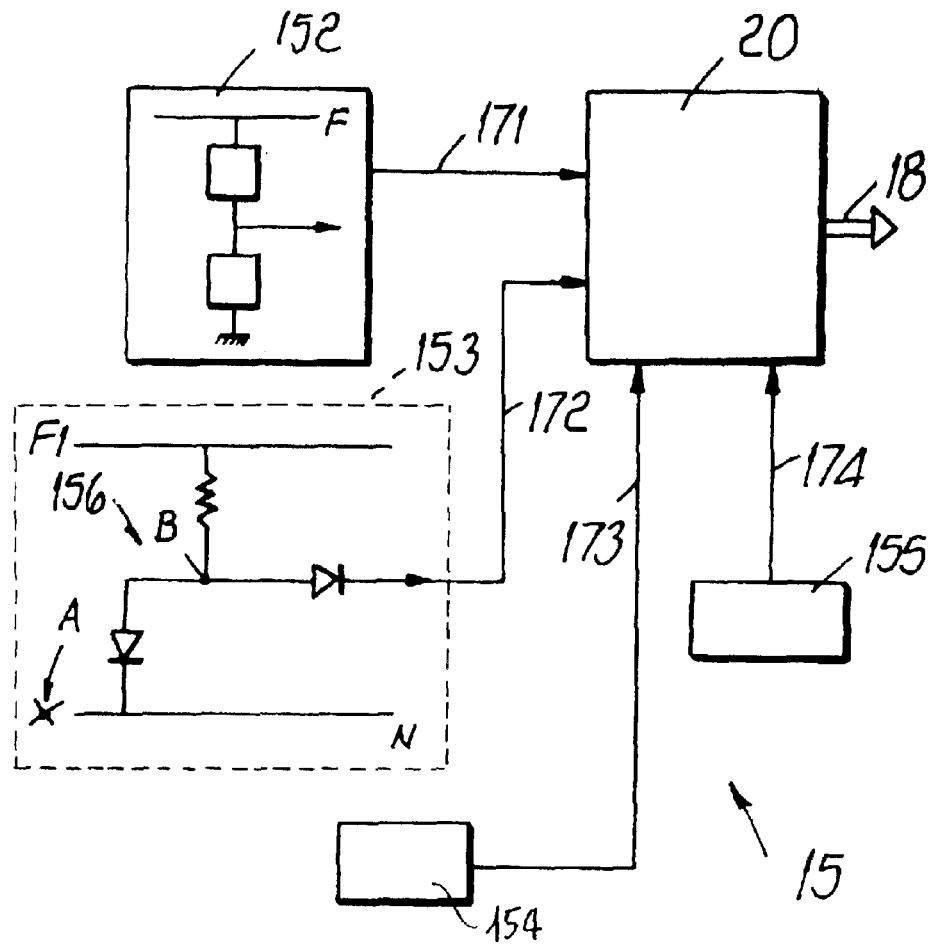
FIG. 6 is a schematic view of another constructive detail of the electronic leakage current device, according to the invention.

With reference now to FIG. 6, the second sensor means 15 preferably comprise a sensor 152 for detecting the voltage of a phase F of said low-voltage power line. The sensor 152 can, for example, be constituted by an ordinary voltage divider. The sensor 152 generates an electric signal 171, indicative of the value of said detected voltage. The electric signal 171 is to be sent to the second electronic means 15 (alternatively the electric signal 171 can be used directly as the voltage input signal 17 of FIG. 4).

The sensor 152 is electrically connected to the second circuit network 20, which generates an electric tripping signal 18.

Again with reference to FIG. 6, the second sensor means 15 can comprise a sensor 153 for detecting the electrical continuity condition of the neutral conductor. The sensor 153 can advantageously comprise a circuit network 156, which is connected to a phase conductor F1, to the neutral conductor N and to the second circuit network 20. The circuit network 156 comprises a resistive element and diodes arranged so as to increase the voltage of the point designated by B once the interruption of the neutral conductor in point A has occurred.

In case of interruption, the sensor 153 generates an electric voltage signal, indicative of the electrical continuity condition of the neutral conductor, to be sent to said second electronic means 15. The sensor 153 is electrically connected to the second circuit network 20, which generates an electric tripping signal 18.

Likewise, the sensor means 15 comprise a sensor 154 for detecting the electrical continuity condition of the earth conductor of the power line and a sensor 155 for detecting the correct connection condition of the phase and neutral conductors. Like the sensor 153, the sensors 154 and 155 comprise a circuit network, which may be similar, in terms of structure and function, to the electric network 156 and generate, respectively, signals 173 and 174.

For example, in the case of the sensor 154, the corresponding circuit network is connected between a phase conductor and the ground conductor of the power line and the second circuit network 20.

In a preferred embodiment (FIG. 2), the first electronic means 34 comprise first circuit means 36 for generating an electric tripping signal after a preset minimum time interval. It is also possible to include second circuit means 46 for defining a minimum value of said earth leakage current, above which an electric tripping signal is to be generated. Also, third circuit means 45 for generating a tripping signal within a maximum time interval, calculated according to a substantial relation of inverse proportionality with respect to an earth leakage current higher than said minimum value, may be included.

Figure 7:
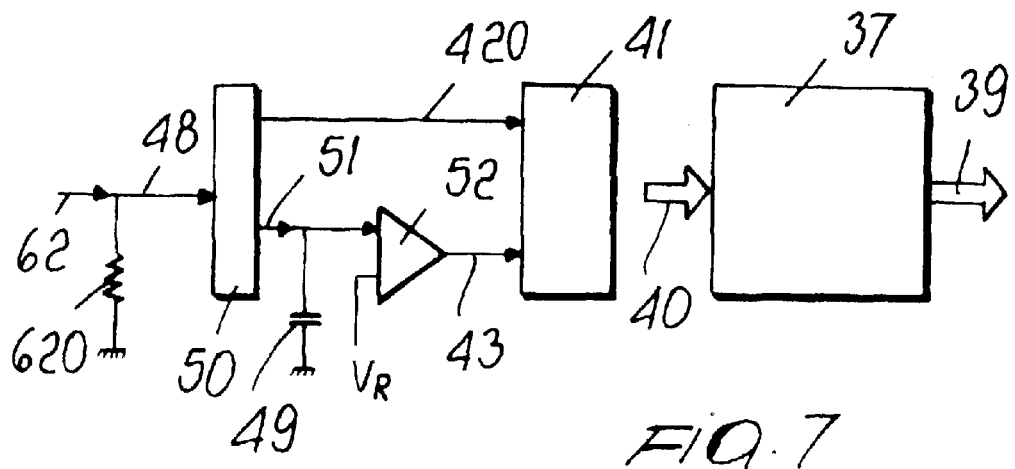
FIG. 7 is a schematic view of another constructive detail of the electronic leakage current device, according to the invention.

Advantageously (FIG. 7), the first electronic means 34 comprise the circuit network 37 for generating an electric tripping signal 39 following the reception in input of an electric current signal 40, and a fourth circuit block 41 for sending, following the reception of third and fourth enable signals (references 42 and 43), an electric current signal 40 in input to the circuit network 37. The circuit block 41 is also meant to perform, following the failed reception of the enable signals 420 and 43, a pre-discharge of said circuit network 37. This can occur by sending in input to the circuit network 37 a current signal 40 of appropriate polarity.

Advantageously, the second circuit means 46 comprise a resistive calibration element 620 for generating (FIG. 7), by virtue of the reception of an electric current signal 62, a first reference voltage 48 which is proportional to said minimum value of the earth leakage current. The third circuit means 45 advantageously comprise a third capacitive element 39 connected to earth and a third circuit block 50. The circuit block 50 is meant to send an electric current signal 51 to the capacitive element 49, depending on the second reference voltage 48, so as to generate a charging voltage across the capacitive element 49 if an earth leakage current higher than said minimum value is present. If an earth leakage current higher than said minimum value is not present, then the signal 51 is sent so as to discharge the capacitive element 49. Advantageously, the circuit block 50 provides, depending on the second reference voltage 48, a first logic signal which is used as enable signal 42.

The third circuit means 45 can furthermore comprise a fifth comparator element 52 which is coupled to the capacitive element 49. The comparator element 52 receives in input the charging voltage across the capacitive element 49 and generates a second logic signal, which is used as enable signal 43, if said charging voltage exceeds a preset reference voltage ($V_R$).

Again with reference to FIG. 7, the operation of the first, second and third circuit means comprised in the electronic protection device according to the invention is described in greater detail.

The calibration resistor 620 generates a reference voltage, depending on which the circuit block charges the capacitive element 49. In particular, if the reference voltage indicates the presence of a value of the earth leakage current which is higher than the minimum value, the block 50 starts the charging process so that the charging time is inversely proportional to the detected earth leakage current. Once charging has been completed (enable signal 43), and if a sufficiently high earth leakage current is still present (enable signal 420), the block 41 charges the capacitive element 42. In order to ensure a constant charging time, charging occurs in a linear manner which is not proportional to the detected earth leakage current. In this manner, a minimum time interval after which the electric tripping signal 39 is generated is set. The described constructive solutions are particularly advantageous, since they allow presetting during design the entire tripping characteristic of the electronic protection device.

The maximum time interval for tripping is in fact defined by the sum of the charging times of the capacitive elements 49 and 42. On the other hand, for earth leakage current values relatively higher than the nominal value, the charging time of the capacitive element 49 becomes negligible, while the charging time of the capacitive element 42 remains constant. Accordingly, a minimum tripping time is set. Finally, the calibration resistor allows determining the minimum tripping current by generating the reference voltage 48. The tripping characteristic of the electronic protection device can therefore be fully defined during design. Accordingly, it is possible to decide in advance the tripping characteristics of the electronic protection device, allowing to better meeting the requirements of the electrical user.

It is also very important that pre-discharge of the capacitive elements 49 and 42 is performed if the conditions for generating an electric tripping signal do not occur, according to the described criteria.

This in fact allows to avoid unwanted tripping events (untimely trippings) caused by accumulations of charge in the capacitive elements 49 and 42. The presence of accumulated charge would in fact reduce the charging times of the capacitive elements 42 and 49 and it would therefore no longer be possible to ensure a preset minimum time interval after which tripping is to occur.

Figure 8:
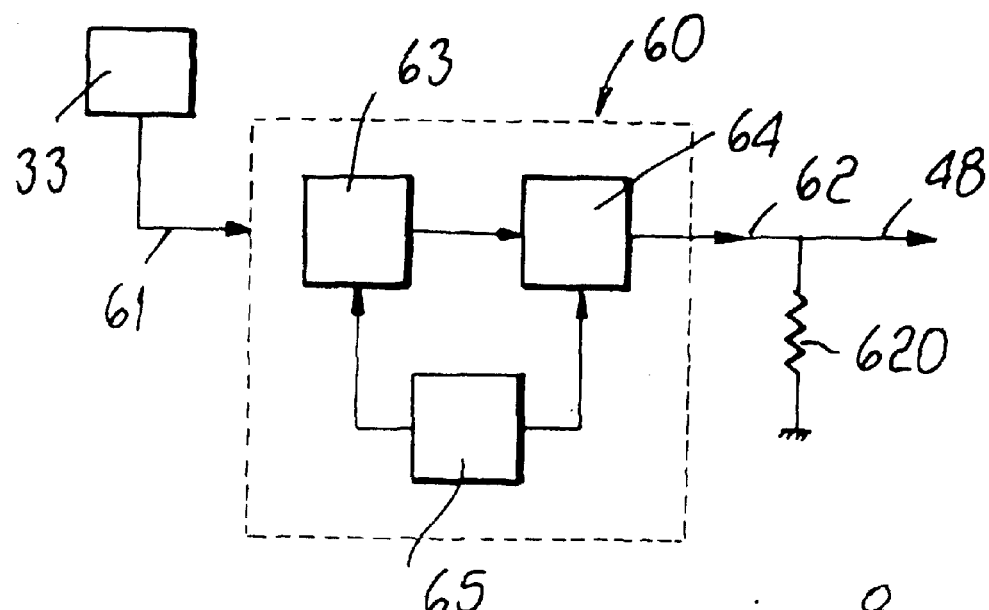
FIG. 8 is a schematic view of another constructive detail of the electronic leakage current device, according to the invention.

In another advantageous embodiment, the first electronic means 34 comprise fourth circuit means 60 for interfacing with the first sensor means 33. With reference to FIG. 8, the fourth circuit means 60 receive from said first sensor means 33 an electric signal 61 which is indicative of the value of the earth leakage current and generate an electric current signal 62 which is indicative of the absolute value of the earth leakage current.

Advantageously, the circuit means 60 comprise a fifth low-impedance circuit block 63, which is electrically connected to the first sensor means 33 so as to ensure their linear operation. A sixth circuit block 64 is furthermore comprised and is electrically connected to the circuit block 63 in order to receive the electric signal 61, indicative of the value of the earth leakage current and in order to generate an electric current signal 62 indicative of the absolute value of the detected earth leakage current. Preferably, the current signal 62 is sent in input to the calibration resistor 620, so as to generate the reference voltage 48.

Advantageously, a seventh filtering circuit block 65 is comprised which is provided with means for eliminating high-intensity noise (protection diodes) and/or high-frequency noise (an RC network). This embodiment is particularly advantageous, since it allows to optimize the performance of the sensor means 33 especially if, as commonly occurs in practice, they comprise a current transformer. In this case, the secondary winding of the current transformer can operate in substantially ideal conditions (i.e. close to the short-circuit condition).

Figure 9:
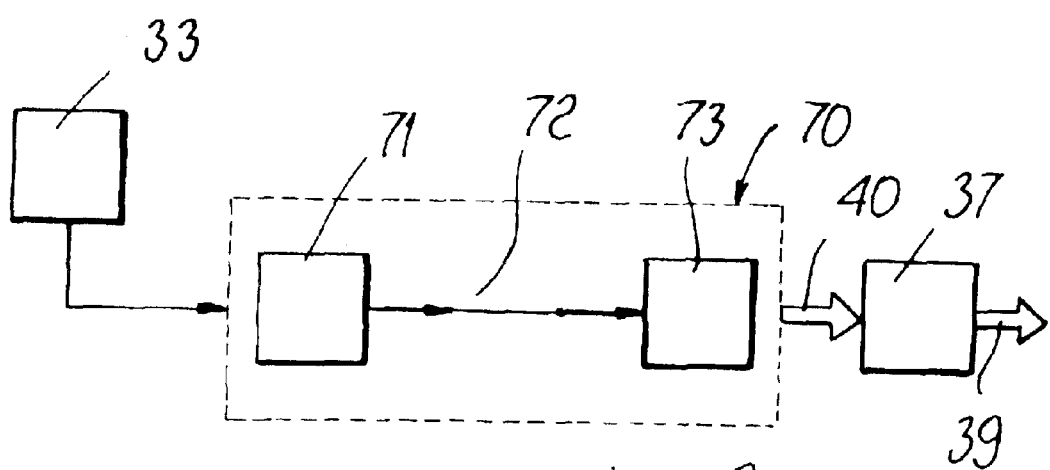
FIG. 9 is a schematic view of another constructive detail of the electronic leakage current device, according to the invention.

In another preferred embodiment, the first electronic means 34 comprise sixth circuit means 70 for generating an electric tripping signal if said first sensor means 33 malfunction. With reference to FIG. 9, the circuit means 70 advantageously comprise a ninth circuit block 71 for measuring predefined physical parameters which are indicative of the operating condition of said first sensor means. For example, if the sensor means comprise a current transformer, it is possible to measure the equivalent resistance of the secondary winding of the transformer. If the values of said physical parameters are not within a preset range, the circuit block 71 generates a third enable signal 72 for a seventh circuit block 73, which is electrically connected to the first circuit network 37. The circuit block 73 generates, following the reception of the enable signal 72, an electric current signal 40 to be sent in input to the circuit network 37, so as to generate an electric tripping signal 39.

This constructive embodiment is particularly advantageous, since it allows to avoid the possibility of failure of the electronic protection device to operate, for example due to possible damage suffered during the assembly of the sensor means 33.

Again with reference to FIG. 2, the actuation means are advantageously connected to fifth circuit means 75 which are suitable to receive an electric tripping signal (39 and/or 18) and to generate one or more command electric signals 750 for activating said actuation means. The fifth circuit means 75 preferably comprise an eighth circuit block (not shown), provided with an output stage of the latch type, which has two stable operating states. The fifth circuit means 75 furthermore advantageously comprise one or more electronic circuits (for example an appropriately configured transistor stage) which ensure a relatively high output current. In this manner, it is possible to drive actuation means of a different type, without substantially modifying the first electronic means 36.

Advantageously, the electronic protection device according to the invention comprises (FIG. 2) third electronic means 130, which are electrically connected to the power line 32 in order to provide a supply voltage $V_{CC}$ to the first and/or second electronic means 34 and 16.

Figure 10:
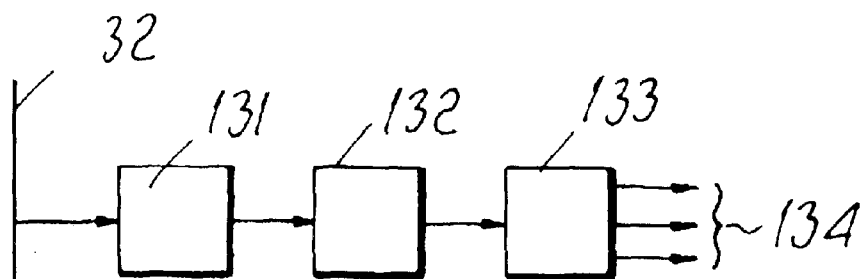
FIG. 10 is a schematic view of another constructive detail of the electronic leakage current device, according to the invention.

With reference to FIG. 10, the third electronic means can comprise, for example, a rectifier stage 131 (for example a diode bridge) which is connected to a filtering stage 132 (for example an RC network), which is in turn connected to a regulator stage 133, suitable to provide the various voltage levels (reference 134) used to supply the various components or for the voltage references (such as for example the reference voltages $V_R$, $V_{R1F1}$, et cetera).

In practice, it has been found that the electronic earth leakage current device 30, according to the invention, fully achieves the intended aim and objects.

Furthermore, it has been ascertained that the electronic earth leakage current device 30 is easy to manufacture at low cost. In particular, the first and/or second and/or third electronic means can be integrated in a microelectronic semiconductor circuit, particularly in a circuit of the ASIC. (Application-Specific Integrated Circuit) type or in a microcontroller.

This allows to considerably reducing room occupation while reducing manufacturing costs and improving operating reliability.

What is claimed is:

1. An electronic earth leakage current device, for a low-voltage power line, comprising:
    a moving contact and a fixed contact which can be mutually coupled/uncoupled; and
    first sensor means for detecting an earth leakage current and for generating an electric signal which is indicative of the value of said earth leakage current; and
    first electronic means which are electrically connected to said first sensor means in order to generate, on the basis of said electric signal which is indicative of the value of said earth leakage current, an electric tripping signal; and
    actuation means, operatively connected to said moving contact, in order to perform, in response to command electric signals, the separation of said moving contact from said fixed contact;
characterized in that it comprises:
    second sensor means for detecting one or more physical values which are indicative of the operating condition of said electronic device for protection against earth leakage current; and
    second electronic means, electrically connected to said second sensor means, for receiving from said second sensor means electric signals which are indicative of the operating condition of said electronic device for protection against earth leakage current and for generating an electric tripping signal depending on said electric signals.

2. An electronic earth leakage current device, according to claim 1, characterized in that said second sensor means comprise at least one sensor arranged inside and/or outside said electronic device for protection against earth leakage current for detecting the operating temperature of said electronic earth leakage current device and for generating an electric signal, indicative of the value of said detected temperature, for said second electronic means.

3. An electronic earth leakage current device, according to claim 1, characterized in that said second sensor means comprise at least one sensor for detecting the voltage of a phase of said low-voltage power line and for generating an electric signal, which is indicative of the value of said detected voltage, to be sent to said second electronic means.

4. An electronic earth leakage current device, according to claim 1, characterized in that said second sensor means comprise at least one sensor for detecting the electrical continuity condition of the neutral conductor of said power line and for generating an electric signal which is indicative of said electrical continuity condition, to be sent to said second electronic means.

5. An electronic earth leakage current device, according to claim 1, characterized in that said second sensor means comprise at least one sensor for detecting the state of electrical continuity of the ground conductor of said power line and for generating an electric signal which is indicative of said electrical continuity condition, to be sent to said second electronic means.

6. An electronic earth leakage current device, according to claim 1, characterized in that said second sensor means comprise at least one sensor for detecting the correct connection condition of the phase and neutral conductors of said power line and for generating an electric signal which is indicative of said connection condition, to be sent to said second electronic means.

7. An electronic earth leakage current device, according to claim 1, characterized in that said first and second electronic means comprise a first circuit network for generating an electric tripping signal following the reception in input of an electric current signal.

8. An electronic earth leakage current device, according to claim 1, characterized in that said second electronic means comprise a second circuit network for generating an electric tripping signal following the reception in input of an electric voltage signal.

9. An electronic earth leakage current device, according to claim 1, characterized in that said first electronic means comprise:
    first circuit means for generating an electric tripping signal after a preset minimum time interval; and/or
    second circuit means for defining a minimum value of said earth leakage current, an electric tripping signal being generated for earth leakage current values higher than said minimum value; and/or
    third circuit means for generating a tripping signal within a maximum time interval, calculated according to a substantial relation of inverse proportionality with respect to a generic current value higher than said minimum value.

10. An electronic earth leakage current device, according to claim 1, characterized in that said first electronic means comprise fourth circuit means for interfacing with said first sensor means, said fourth circuit means receiving from said first sensor means an electric signal indicative of the value of said earth leakage current and generating an electric current signal of the absolute value of said earth leakage current.

11. An electronic earth leakage current device, according to claim 1, characterized in that said actuation means are electrically connected to fifth circuit means which are suitable to receive said electric tripping signal from said first and/or second electronic means and to generate one or more command electric signals for activating said actuation means.

12. An electronic earth leakage current device, according to claim 1, characterized in that said first electronic means comprise sixth circuit means for generating an electric tripping signal if said first sensor means malfunction.

13. An electronic earth leakage current device, according to claim 1, characterized in that it comprises third electronic means which are electrically connected to said low-voltage power line in order to provide a supply voltage to said first and/or second electronic means.

14. An electronic earth leakage current device, according to claim 1, characterized in that said first and/or second and/or third electronic means are at least partially integrated in one or more microelectronic semiconductor circuits.

15. An electronic earth leakage current device, according to claim 2, characterized in that said second sensor means comprise at least one sensor for detecting the voltage of a phase of said low-voltage power line and for generating an electric signal, which is indicative of the value of said detected voltage, to be sent to said second electronic means.

16. An electronic earth leakage current device, according to claim 2, characterized in that said second sensor means comprise at least one sensor for detecting the electrical continuity condition of the neutral conductor of said power line and for generating an electric signal which is indicative of said electrical continuity condition, to be sent to said second electronic means.

17. An electronic earth leakage current device, according to claim 3, characterized in that said second sensor means comprise at least one sensor for detecting the electrical continuity condition of the neutral conductor of said power line and for generating an electric signal which is indicative of said electrical continuity condition, to be sent to said second electronic means.

18. An electronic earth leakage current device, according to claim 2, characterized in that said second sensor means comprise at least one sensor for detecting the state of electrical continuity of the ground conductor of said power line and for generating an electric signal which is indicative of said electrical continuity condition, to be sent to said second electronic means.

19. An electronic earth leakage current device, according to claim 3, characterized in that said second sensor means comprise at least one sensor for detecting the state of electrical continuity of the ground conductor of said power line and for generating an electric signal which is indicative of said electrical continuity condition, to be sent to said second electronic means.

20. An electronic earth leakage current device, according to claim 3, characterized in that said second sensor means comprise at least one sensor for detecting the state of electrical continuity of the ground conductor of said power line and for generating an electric signal which is indicative of said electrical continuity condition, to be sent to said second electronic means.

* * * * *